United States Patent [19]
Clark

[11] Patent Number: 6,156,145
[45] Date of Patent: Dec. 5, 2000

[54] METHOD OF MANUFACTURING MULTI-LAYERED FLEXTENSIONAL PIEZOELECTRIC TRANSDUCER

[75] Inventor: Stephen Clark, Norfolk, Va.

[73] Assignee: Face International Corp., Norfolk, Va.

[21] Appl. No.: 09/138,462

[22] Filed: Aug. 21, 1998

[51] Int. Cl.[7] .............................. B32B 31/04; B32B 31/20
[52] U.S. Cl. ...................... 156/160; 156/309.9; 156/311; 156/228; 29/25.35; 29/446
[58] Field of Search ................... 29/25.35, 446; 156/160, 242, 245, 311, 322, 309.9, 228

[56] References Cited

U.S. PATENT DOCUMENTS

| | | | |
|---|---|---|---|
| 2,509,439 | 5/1950 | Langer . | |
| 3,773,580 | 11/1973 | Provost | 156/66 |
| 3,808,073 | 4/1974 | Navarre | 156/64 |
| 3,850,725 | 11/1974 | Spielau et al. | 156/291 |
| 3,952,898 | 4/1976 | Bayer | 215/12 R |
| 3,960,635 | 6/1976 | LaRoy et al. | 156/286 |
| 5,868,882 | 2/1999 | Kern, Jr. et al. | 156/73.1 |
| 5,891,291 | 4/1999 | Okamoto et al. | 156/273.9 |

*Primary Examiner*—Sam Chuan Yao
*Attorney, Agent, or Firm*—Stephen E. Clark; David J. Bolduc

[57] ABSTRACT

A method for manufacturing a multi-layer piezoelectric transducer having enhanced mechanical output displacement capability resulting from an increase in the amount of "pre-stress" applied to the electroactive (ceramic) layer by the pre-stress layer. The pre-stress layer is heated to a temperature above the temperature of the ceramic layer and bonded at an elevated temperature to the ceramic layer, such that, as the pre-stress layer subsequently cools down to ambient temperature, it applies a compressive stress to the ceramic layer. During the step of cooling the layers to ambient temperature, the temperature drop of the pre-stress layer is greater than the temperature drop of the ceramic layer, thereby increasing the amount of "pre-stress" applied to the electroactive (ceramic) layer by the pre-stress layer.

1 Claim, 7 Drawing Sheets

METHOD OF MANUFACTURING MULTI-LAYERED FLEXTENSIONAL PIEZOELECTRIC TRANSDUCER

BACKGROUND OF THE INVENTION

1. Field of Invention

The present invention generally relates to electrically active ceramic devices and, more particularly, to a method of making high deformation flextensional piezoelectric transducers.

2. Description of the Prior Art

Piezoelectric and electrostrictive materials develop a polarized electric field when placed under stress or strain. Conversely, they undergo dimensional changes in an applied electric field. The dimensional change (i.e., expansion or contraction) of a piezoelectric or electrostrictive material is a function of the applied electric field.

A typical prior ceramic device such as a direct mode actuator makes direct use of a change in the dimensions of the material, when activated, without amplification of the actual displacement. Direct mode actuators typically include a piezoelectric or electrostrictive ceramic plate sandwiched between a pair of electrodes formed on its major surfaces. The device is generally formed of a sufficiently large piezoelectric and/or electrostrictive coefficient to produce the desired strain in the ceramic plate. However, direct mode actuators suffer from the disadvantage of only being able to achieve a very small displacement (strain), which is, at best, only a few tenths of a percent.

Indirect mode actuators are known in the prior art to provide greater displacement than is achievable with direct mode actuators. Indirect mode actuators achieve strain amplification via external structures. An example of an indirect mode actuator is a flextensional transducer. Prior flextensional transducers are composite structures composed of a piezoelectric ceramic element and a metallic shell, stressed plastic, fiberglass, or similar structures. The actuator movement of conventional flextensional devices commonly occurs as a result of expansion in the piezoelectric material which mechanically couples to an amplified contraction of the device in the transverse direction. In operation, they can exhibit several orders of magnitude greater displacement than can be produced by direct mode actuators.

The magnitude of the strain of indirect mode actuators can be increased by constructing them either as "unimorph" or "bimorph" flextensional actuators. A typical unimorph is a concave structure composed of a single piezoelectric element externally bonded to a flexible metal foil, and which results in axial buckling or deflection when electrically energized. Common unimorphs can exhibit a strain of as high as 10% but can only sustain loads which are less than one pound. A conventional bimorph device includes an intermediate flexible metal foil sandwiched between two piezoelectric elements. Electrodes are bonded to each of the major surfaces of the ceramic elements and the metal foil is bonded to the inner two electrodes. Bimorphs exhibit more displacement than comparable unimorphs because under the applied voltage, one ceramic element will contract while the other expands. Bimorphs can exhibit strains up to 20% (i.e. about twice that of unimorphs), but, like unimorphs, typically can only sustain loads which are less than one pound.

A unimorph actuator called "THUNDER", which has improved displacement and load capabilities, has recently been developed and is disclosed in U.S. Pat. No. 5,632,841. THUNDER (which is an acronym for THin layer composite UNimorph ferroelectric Driver and sEnsoR), is a unimorph actuator in which a pre-stress layer is bonded to a thin piezoelectric ceramic wafer at high temperature, and during the cooling down of the composite structure asymmetrically stress biases the ceramic wafer due to the difference in thermal contraction rates of the pre-stress layer and the ceramic layer.

The construction of a prior THUNDER actuator 12 is illustrated in FIG. 1. A PZT piezoelectric ceramic layer 67 which is electroplated 65 and 65a on its two major faces is adhered to a metal pre-stress layer 64 by an adhesive layer 66. The adhesive layer 66 is preferably LaRC-SI™ material, a thermoplastic polyimide developed by NASA-Langley Research Center an disclosed in U.S. Pat. No. 5,639,850, and which is commercially marketed by IMITEC, Inc. of Schenectady, N.Y. During manufacture of the THUNDER actuator 12 the ceramic layer 67, the adhesive layer 66 and the pre-stress layer 64 are simultaneously heated to a temperature above the melting point of the adhesive material, and then subsequently allowed to cool, thereby re-solidifying and setting the adhesive layer 66.

In practice the various layers composing the THUNDER actuator (namely the ceramic layer 67, the adhesive layer 66 and the pre-stress layer 64) are typically placed inside of an autoclave or a convection oven as a composite structure, and slowly heated by convection until all the layers of the structure reach a temperature which is above the melting point of the adhesive 66 material but below the Currie temperature of the ceramic layer 67. It is desirable to keep the temperature of the ceramic layer 67 beneath the Currie temperature of the ceramic layer in order to avoid disrupting the piezoelectric characteristics of the ceramic layer 67. Because the multi-layer structure is typically convectively heated at a slow rate, all of the layers tend to be at approximately the same temperature. In any event, because the adhesive layer 66 is typically located between two other layers (i.e. between the ceramic layer 67 and the pre-stress layer 64), the two outer layers (i.e. the ceramic layer 67 and the pre-stress layer 64) are usually very close to the same temperature and are at least as hot as the adhesive layer 67 during the heating step of the process.

During the cooling step of the process (i.e. after the adhesive layer 67 has re-solidified) the ceramic layer 67 becomes compressively stressed by the pre-stress layer 64, due to the higher coefficient of thermal contraction of the material of the pre-stress layer 64 than of the material of the ceramic layer 67. Also, due to the greater thermal contraction of the laminate materials (e.g. the pre-stress layer 64 and the adhesive layer 66) than that of the ceramic layer 67, the ceramic layer typically deforms into an arcuate shape having a normally concave face 12a and a normally convex face 12c, as illustrated in FIG. 1.

In operation the THUNDER actuator 12 may be energized by an electric power supply 22 via a pair of electrical wires 26 and 24 which are in electrical communication with the electroplated 65 and 65a faces of the ceramic layer 67.

It will be appreciated from an understanding of the preceding overview of the prior art that the mechanical output displacement capability of a piezoelectric transducer can be increased by increasing the amount of "pre-stress" applied to the ceramic layer 67 by the pre-stress layer 64.

It will further be understood that the amount of pre-stress which can be applied to a given ceramic layer 67 (having a known coefficient of thermal contraction) by a given pre-stress layer 64 (having a known coefficient of thermal contraction) depends on the change in temperature of the pre-stress layer 64 and depends on the change in temperature of the ceramic layer 67 during the cooling step of the manufacturing process. More specifically, for a given ceramic layer 67 (of known dimensions and known coefficient of thermal contraction) and a given pre-stress layer 64 (of known dimensions and known coefficient of thermal contraction), the amount of pre-stressing of the ceramic layer 67 can be increased by increasing the temperature drop of the pre-stress layer 64 and by decreasing the temperature drop of the ceramic layer 67 during the step of cooling of the adhesive layer 66.

A problem associated with the prior method of manufacturing multi-layered piezoelectric transducers which uses either autoclaves or ovens to heat the pre-stress layer 64, the adhesive layer 66, and the ceramic layer 67 as a composite structure to the same temperature is that (during the adhesive cooling step) the temperature of the ceramic layer 64 drops as far as the temperature of the pre-stress layer 67 drops. Thus, in the prior method of manufacturing such devices, it is not possible to vary (i.e. minimize) the temperature drop of the ceramic layer during the cooling step without disadvantageously reducing the temperature drop of the pre-stress layer 64.

Accordingly, it would be desirable to provide a method of manufacturing a pre-stressed flextensional piezoelectric actuator in which, during the cooling step of the process, the temperature drop of the pre-stress layer 64 is greater than the corresponding temperature drop of the ceramic layer 67.

SUMMARY OF THE INVENTION

In view of the foregoing disadvantages inherent in the known types of piezoelectric actuators and methods for manufacturing same now present in the prior art, the present invention provides a method for manufacturing a multi-layer piezoelectric transducer having enhanced mechanical output displacement capability resulting from an increase in the amount of "pre-stress" applied to the electroactive (ceramic) layer by the pre-stress layer.

Accordingly, it is an object of the present invention to provide a method of manufacturing a high deformation piezoelectric ceramic transducer which improves upon the prior art.

It is another object of the present invention to provide a manufacturing process of the character described which produces a high deformation transducer having improved mechanical displacement.

It is another object of the present invention to provide a manufacturing process of the character described wherein a pre-stress layer is bonded at an elevated temperature to a ceramic layer, such that, as the pre-stress layer subsequently cools down to ambient temperature, it applies a compressive stress to the ceramic layer.

It is another object of the present invention to provide a manufacturing process of the character described wherein the pre-stress layer is heated to a temperature above the temperature of the ceramic layer, such that during the step of cooling the layers to ambient the temperature drop of the pre-stress layer is greater than the temperature drop of the ceramic layer.

Further objects and advantages of this invention will become apparent from a consideration of the drawings and ensuing description thereof.

DESCRIPTION OF THE PREFERRED EMBODIMENTS

With reference directed toward the appended drawings, a pre-stressed high deformation piezoelectric transducer manufactured embodying the principles and concepts of the present invention will be described.

Figure 1:
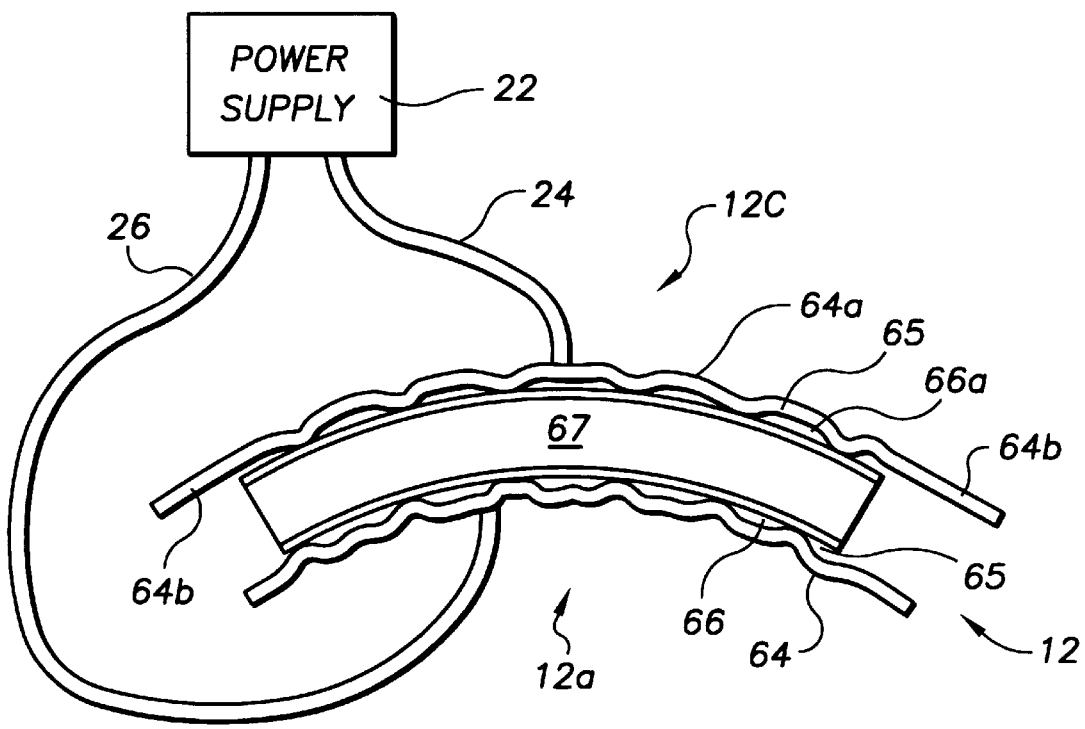
FIG. 1 is a side elevation of a high deformation piezoelectric transducer made in accordance with the prior art.
Figure 2:
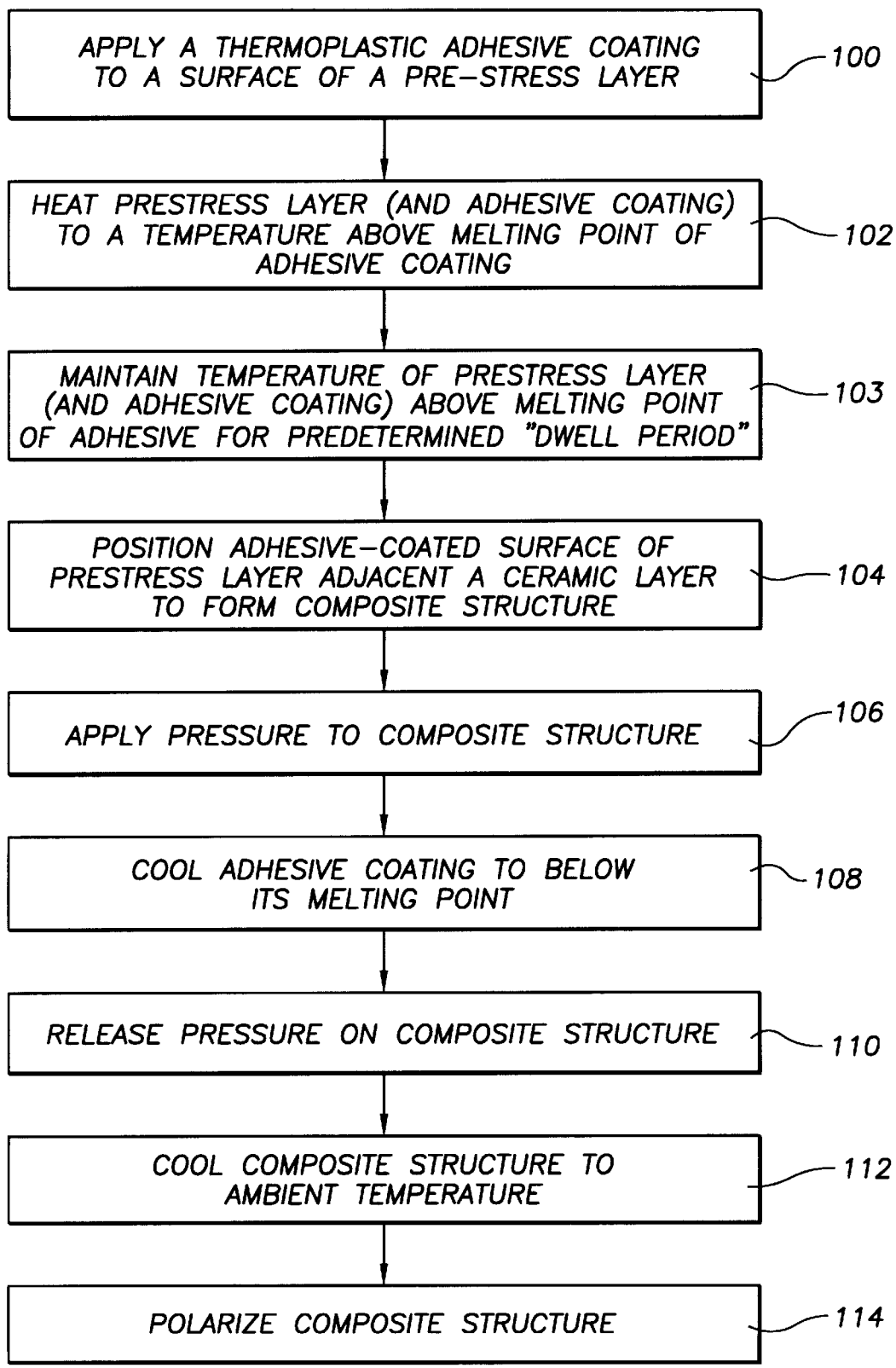
FIG. 2 is a schematic flow diagram showing a method of manufacturing piezoelectric transducers in accordance with the preferred embodiment of the present invention.

FIG. 2 is a flow diagram showing the steps in the preferred embodiment of the present invention, wherein individual steps are denoted by three-digit reference indicia.

Figure 4:
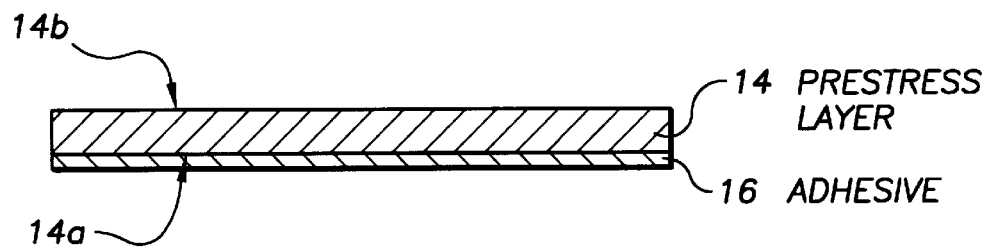
FIG. 4 is a cross-sectional elevation showing an adhesive-coated pre-stress layer used in the present invention.
Figure 5:
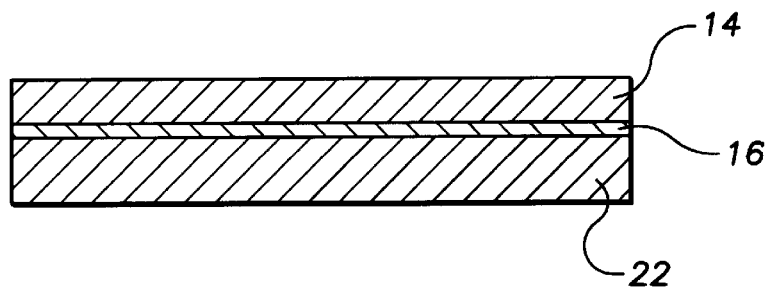
FIG. 5 is a cross-sectional elevation showing an adhesive-coated pre-stress layer positioned adjacent an electroplated piezoelectric wafer in accordance with the present invention.

The first step in the preferred embodiment of the present invention is to apply 100 a thermoplastic adhesive layer 16 to a major surface of a metal pre-stress layer 14. The adhesive layer 16, which may initially be either in the form of a spray, a gel, a liquid, or a thin deformable sheet, may be brushed, sprayed or disposed by another conventional method to the pre-stress layer 14, as indicated in FIG. 4. In the preferred embodiment of the invention the thermoplastic adhesive layer 16 is made of a soluble imide, such as LaRC-SI™, having a high melting temperature (i.e. several hundred degrees Fahrenheit) and high tensile strength. Also, in the preferred embodiment of the invention, the pre-stress layer 14 is a nominally flat metallic foil or sheet having two opposing major surfaces 14a and 14b. Regardless of whether the pre-stress layer 14 is a metallic or non-metallic material 14, it should have a coefficient of thermal contraction which is lower than that of the ceramic layer 22.

Figure 6:
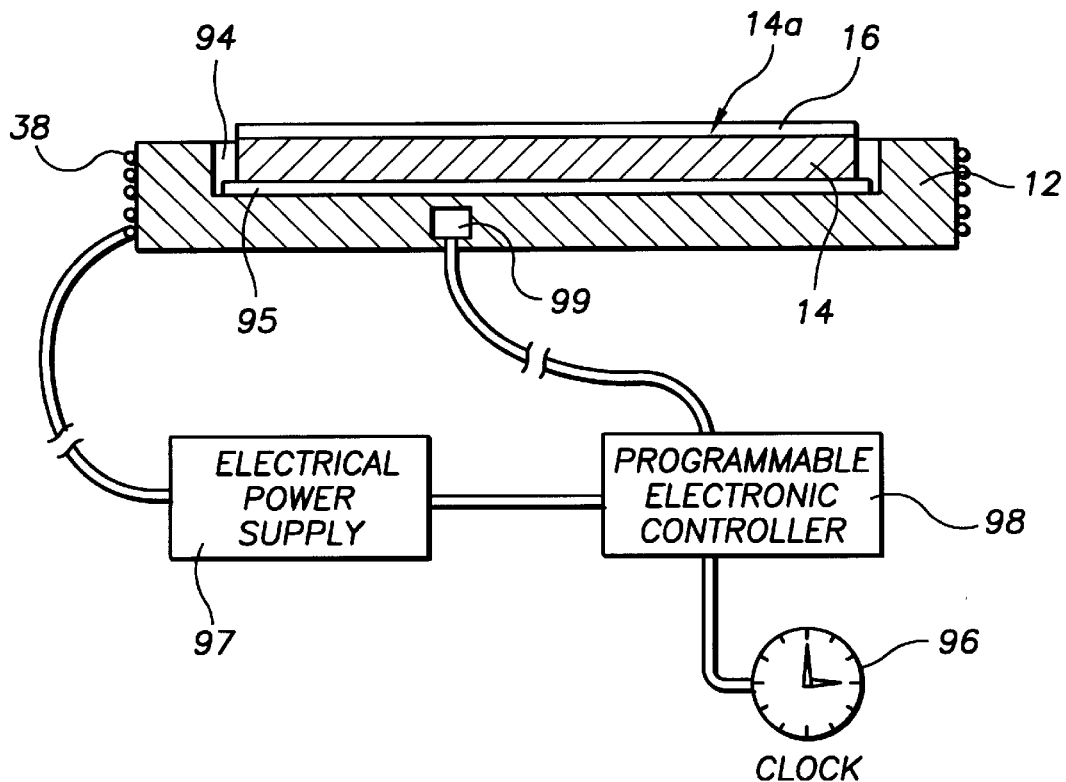
FIGS. 6–9 are a cross-sectional elevation showing the various layers of a piezoelectric transducer in sequential stages of manufacture in accordance with the present invention.

The next step in the process is to heat 102 the pre-stress layer 14 (and its adhesive coating 16) to a temperature above the melting point of the adhesive 16. In practice this can be accomplished, for example, by placing the pre-stress layer 14 (and its adhesive coating 16) onto a heater plate 12, as illustrated in FIG. 6. The heater plate 12 may be heated, for example, by an electrical resistance heater 38 which is connected to an electrical power supply 97. A recess 94 may be provided in the heater plate 12 in order to maintain proper alignment of the pre-stress layer 14. A heater plate liner 95 made of a material such as fiberglass cloth may be provided between the heater plate 12 and the pre-stress layer to cushion the pre-stress layer 14. In an alternative embodiment of the invention (not illustrated), the pre-stress layer 14 (and its adhesive coating 16) may first be "pre-heated", for example in a convection oven, to a temperature near, but below, the melting point of the adhesive 16, and subsequently heated 102 (for example via conduction from the heater plate 12) to a temperature above the melting point of the adhesive 16.

Figure 7:
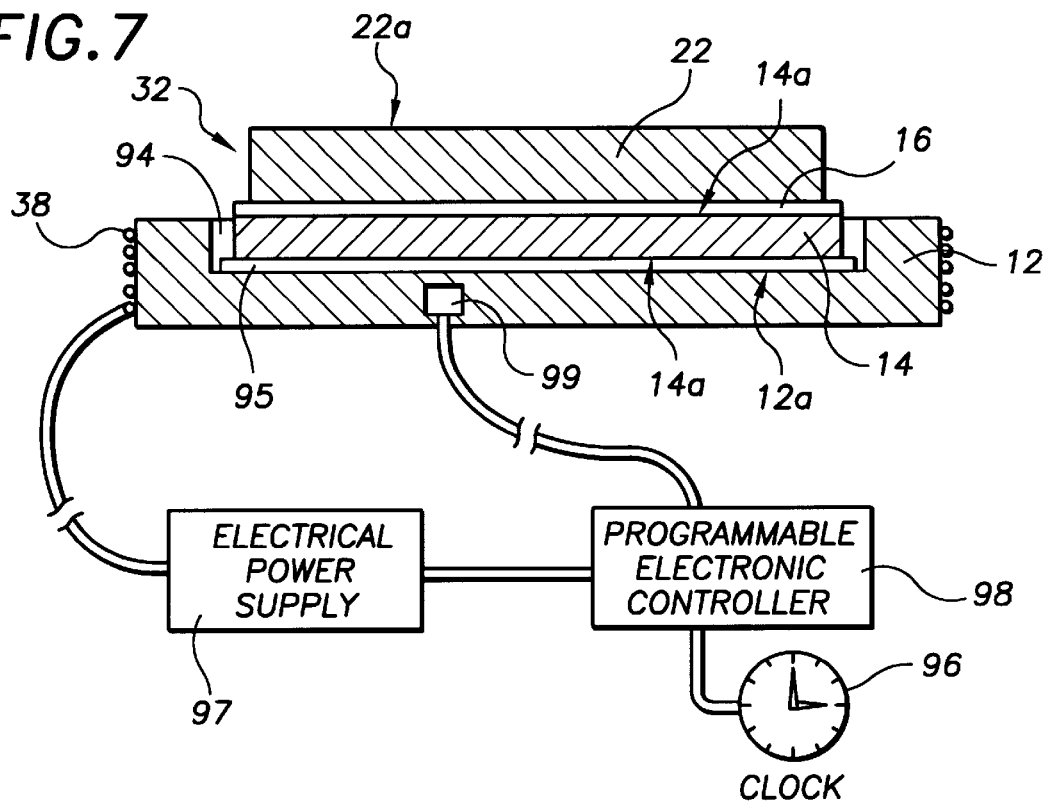

The next step in the process is to position 104 a piezoelectric ceramic layer 22 adjacent the adhesive-coated surface 14*a* of the pre-stress layer 14, so as to form a multi-layer composite structure 32 as illustrated in FIG. 7. In the preferred embodiment of the invention the ceramic layer 22 comprises a piezoelectric ceramic wafer which is electroplated (not shown) on its two opposing major faces. In the preferred embodiment of the invention the temperature of the ceramic layer 22 is below the temperature of the metal pre-stress layer 14 when the two layers (14 and 22) are placed adjacent each other (with the adhesive layer 16 interposed therebetween).

Figure 8:
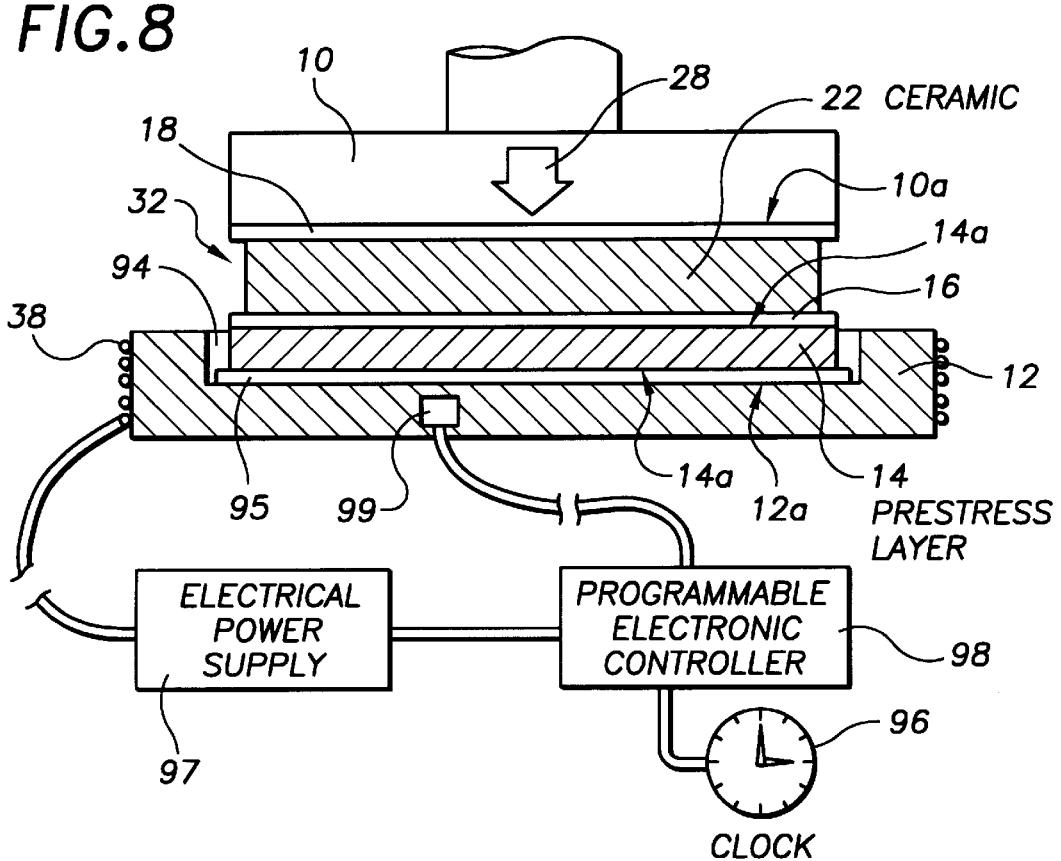

The next step in the process is to apply 106 pressure to the multi-layer composite structure 32, so as to press the major surfaces of the ceramic layer 22 and the pre-stress layer 14 towards each other. This may be accomplished, for example, by a press member 10 which applies a force (indicated in FIG. 8 by arrow 28) against the composite structure 32. This force 28 causes excess (liquid) adhesive 16 to be pressed out from between the ceramic layer 22 and the pre-stress layer 14, which ensures a better bond between the two facing layers (14 and 22).

The next step in the process is to cool 108 the adhesive layer 16 to below its melting point. After the (relatively cooler) ceramic layer 22 is positioned adjacent the (relatively hotter) pre-stress layer 14, electrical energy flow from the electrical power supply 97 to the resistance heater is reduced (or completely turned off), allowing the temperature of the pre-stress layer 14 and the adhesive layer 16 to begin to cool down. Due to thermal conduction between the (relatively cooler) ceramic layer 22 and the (relatively hotter) pre-stress layer 14, when the two layers (14 and 22) are first positioned adjacent each other there is an initial flow of heat from the pre-stress layer 14 to the ceramic layer 22, causing the temperature of the pre-stress layer 14 to decrease and causing the temperature of the ceramic layer 22 to increase until the two layers (14 and 22) reach, or nearly reach, the same temperature. Because electrical energy to the heater plate 12 has now been reduced, the temperature of the composite structure 32, drops below the melting point of the adhesive 16.

The next step in the process is to release 110 the pressure on the composite structure 32. This can be accomplished, for example, by removing the press member 10 from the composite structure 32, as indicated by arrow 24 in FIG. 9.

Figure 9:
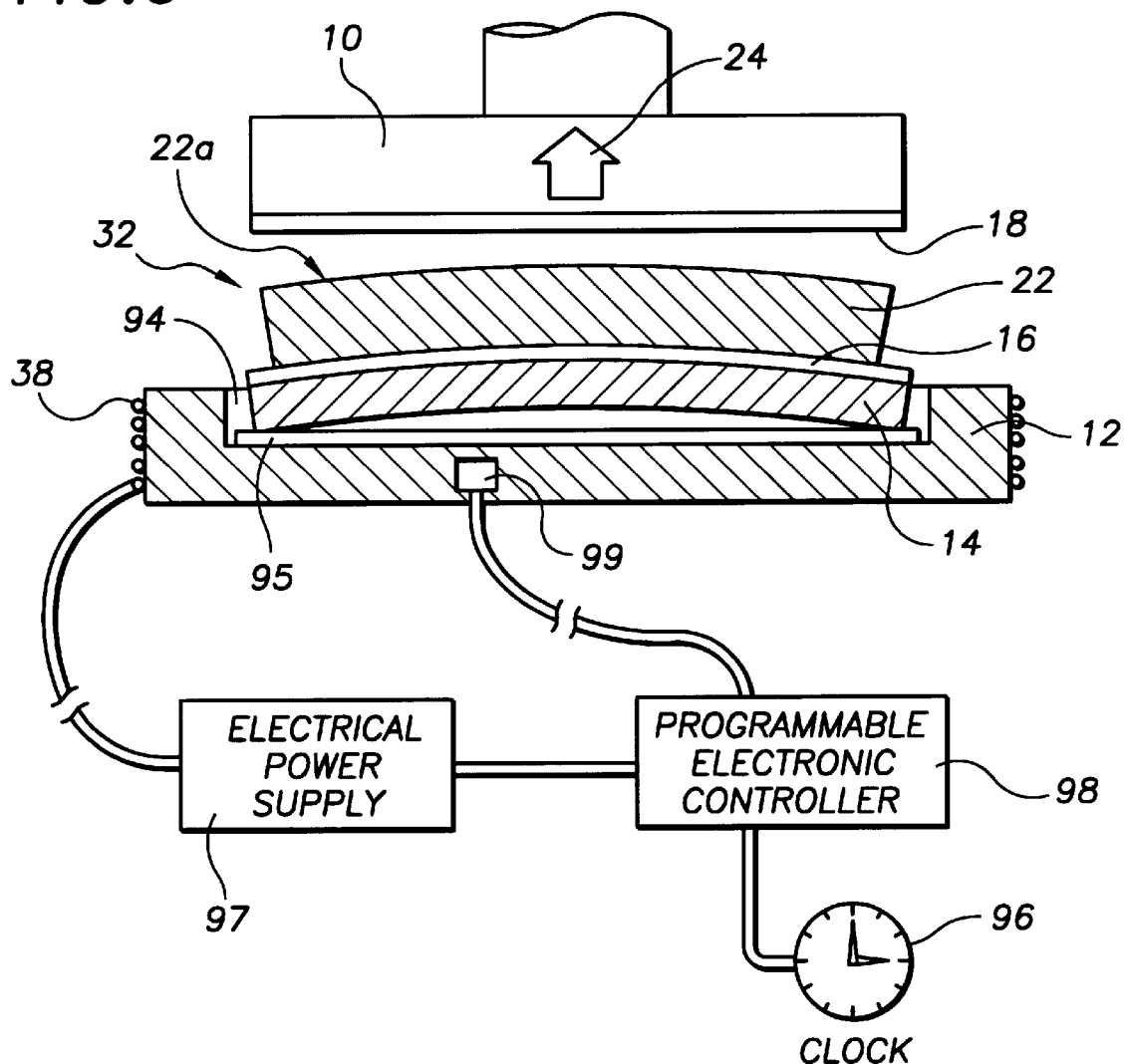

The next step in the process is to cool the composite structure 32 down to the ambient (i.e. room) temperature. As the pre-stress layer 14 cools down, it (the pre-stress layer) compressively stresses the ceramic layer 22 due to (1) the difference between the thermal contraction coefficients of the ceramic layer 22 and the pre-stress layer 14 and (2) the difference between the temperature drop (to ambient) of the ceramic layer 22 and the pre-stress layer 14. Due to the asymmetrical pre-stress applied to the ceramic layer 22 by the pre-stress layer 22, the entire composite structure bows into a arcuate or dome shape, as illustrated in FIG. 9.

After the composite structure 32 has been cooled to ambient (i.e. room) temperature, a voltage potential is applied across the electroplated major surfaces of the ceramic layer 22, thereby electrically polarizing 114 the ceramic layer 22.

In some embodiments of the invention it may be desirable to control the rate at which the temperature of the composite structure 32 is decreased during the cooling step 112, or to control the amount of time which the pre-stress layer 14 and the adhesive layer 16 are maintained 103 above the melting temperature of the adhesive material. Accordingly, in the preferred embodiment of the invention, means are provided for determining the temperature of the of the pre-stress layer 14, and means are provided for regulating the rate of change of temperature of the composite structure 32. In the preferred embodiment of the invention the means for determining the temperature of the pre-stress layer 14 comprises a thermocouple sensor 99 which is in contact with the heater plate 38. The thermocouple sensor 99 is calibrated such that the temperature sensed (i.e. the temperature of the heater plate 38) corresponds to, and is therefore indicative of, the temperature of the composite structure 32. In the preferred embodiment of the invention the means for regulating the rate of change of temperature of the composite structure 32 comprises a programmable electronic controller 98 and associated clock 96 which are in electrical communication with the electrical power source 97.

In the preferred embodiment of the invention the composite structure-engaging surfaces of the press member 10*a* and the heater plate 12*a* are nominally flat and, more specifically, correspond to the shape(s) of the surfaces 22*a* and 14*a*, respectively, of the composite structure with which they are engaged during the step of applying 106 pressure to the composite structure. A press liner 18 may be provided at the face 10*a* of the press member 10, such as illustrated in FIGS. 6, 7, 8 and 9. The press liner 18 may be constructed of a fiberglass cloth or other material which can deform sufficiently to accommodate small imperfections (i.e. granular size bumps) on the surface 22*a* on the surface of the ceramic layer 22.

Figure 10:
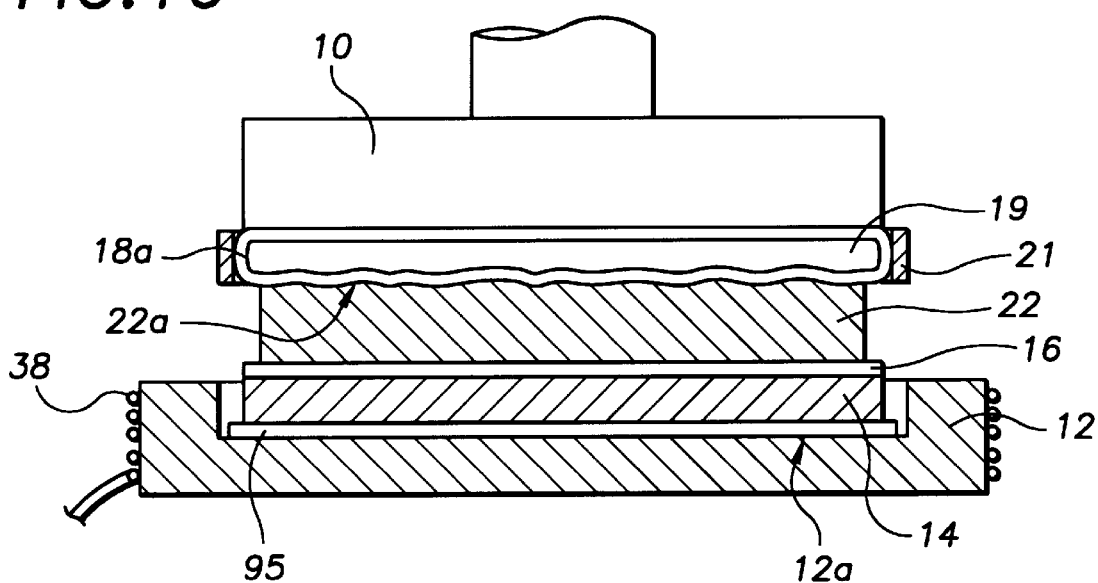
FIG. 10 is a cross-sectional elevation showing a press member with a modified press liner.
Figure 11:
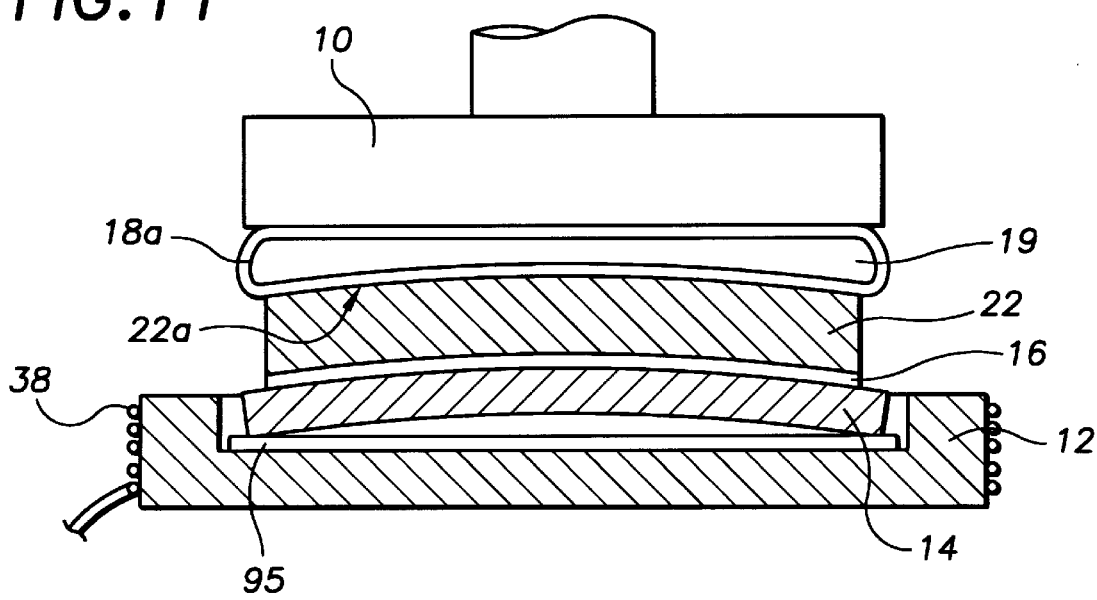
FIG. 11 is a cross-sectional elevation showing a press member with a modified press liner.

In an alternate embodiment of the invention, a modified press liner 18*a* may be in the form of a sealed bladder enclosing a fluid 19, such as illustrated in FIG. 9 and FIG. 10. An annular retention ring 21, such as illustrated in FIG. 10, may be provided around the periphery of the modified press liner 18. Because the modified press liner 18 is constructed of a fluid-filled, sealed, deformable bladder, whenever the modified press liner 18*a* is engaged with the top surface 22*a* of the ceramic layer 22, the modified press liner 18*a* deforms so as to evenly distribute the force which it applies to the ceramic layer 22. Because the modified press liner 18*a* deforms in this manner, the pressure applied by the press member 10 to the composite ceramic layer 22 is substantially uniform across the entire major surface 22*a* of the ceramic layer, regardless of surface roughness (as illustrated in FIG. 10) or surface curvature (as illustrated in FIG. 11) of the ceramic layer 22.

It will be understood from the foregoing description that the present invention provides a method of manufacturing a flextensional piezoelectric transducer in which the magnitude of the pre-stress that is applied to the ceramic layer 22 by the pre-stress layer 14 is augmented by the difference in temperature drop of the two layers (14 and 22) during the cooling step 112 of the process.

Figure 3:
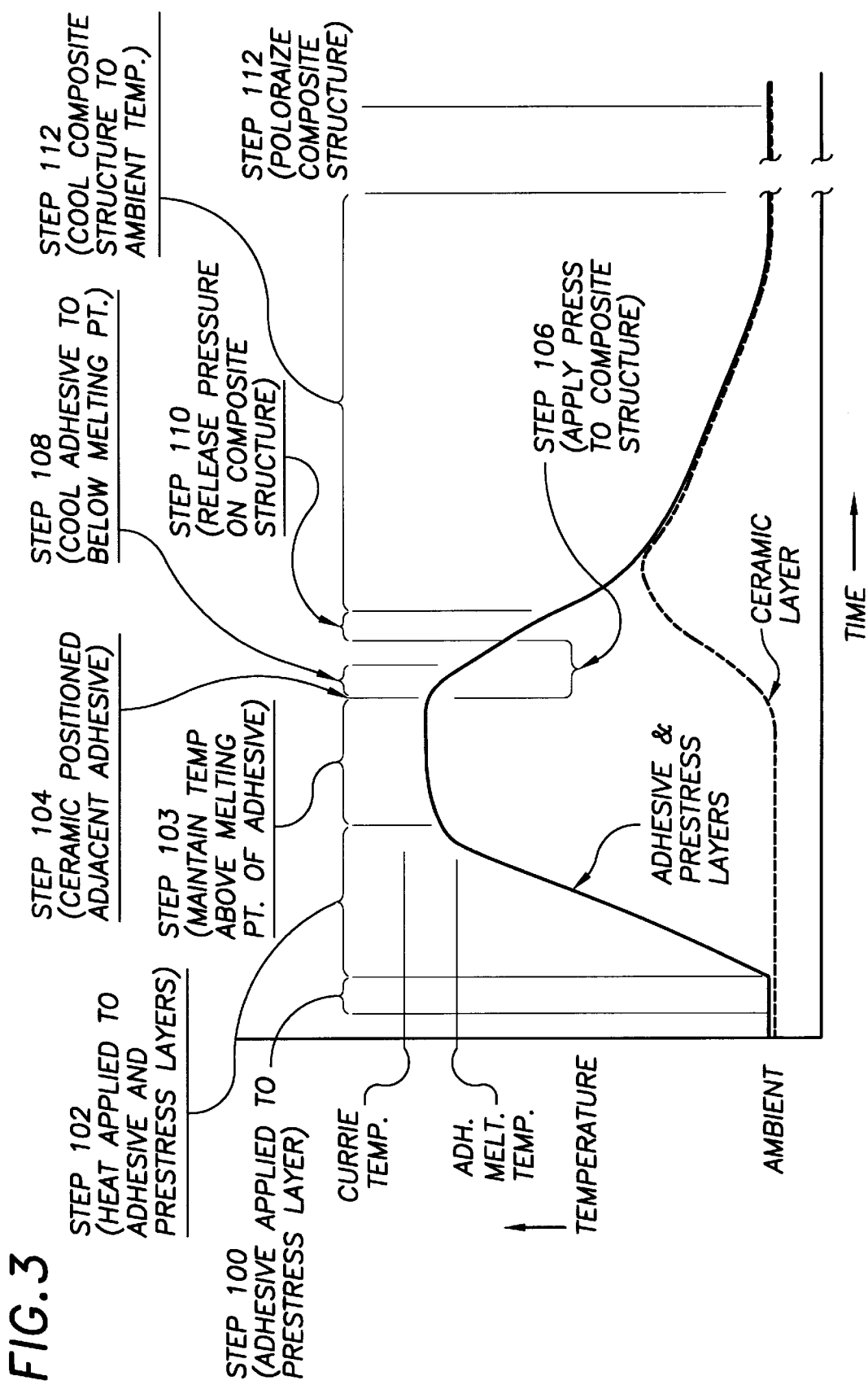
FIG. 3 is a graph which plots temperatures of the various components of a piezoelectric transducer versus time during the manufacturing process in accordance with the present invention.

FIG. 3 is a graph which summarizes the temperature characteristics of the pre-stress layer 14, the adhesive layer 16 and the ceramic layer 22, versus time during the disclosed manufacturing process. It will be understood from the foregoing disclosure that the displacement capabilities of a trandsducer manufactured in accordance with the present invention are enhanced by minimizing the temperature drop of the ceramic layer 22 to ambient temperature during the cooling step 112 of the composite structure. Although in the preferred embodiment of the invention the temperature of the ceramic layer 22 is initially at ambient (i.e. room)

temperature when it is brought into contact with the adhesive layer 16 (step 104), it is within the scope of the present invention to preheat the ceramic layer 22 to a temperature above ambient (i.e. room) temperature but below the temperature of the pre-stress layer 14 prior to bringing the ceramic layer 22 into contact with the pre-stress layer 14 and/or the adhesive layer 16.

The foregoing disclosure describes a method of manufacturing a pre-stressed, multi-layer piezoelectric transducer wherein two adjacent layers are bonded together by a thermoplastic adhesive, and during which process the adjacent layers are at different temperatures when first positioned adjacent each other. It will be appreciated that the disclosed process may similarly be employed to enhance the stength of other multi-layered, pre-stressed composite structures besides piezoelectric transducers. For example, the disclosed process may similarly be employed to produce pre-stressed, multi-layered structural members such as sheets, beams and columns. Accordingly, it will be understood that the disclosed process may be used to produce a wide range of pre-stressed, multi-layered structures.

While the above description contains many specificities, these should not be construed as limitations on the scope of the invention, but rather as an exemplification of one embodiment and a few modifications thereof. Many other variations are possible, for example:

The composite structure 32 may comprise more layers that have been described and illustrated in the above specification;

A modified flextensional transducer can be manufactured using a modification of the present invention wherein the pre-stress layer comprises only a thermoplastic material (such as LaRC-SI™) which is first heated above its melting point, then applied directly to a (relatively cooler) ceramic wafer, and the composite structure (i.e. the thermoplastic material and the ceramic wafer) is subsequently cooled to ambient (i.e. room) temperature, whereby the thermoplastic material applies a compressive stress to the ceramic wafer in accordance with the present invention;

Adhesives, preferably polyimides, other than LaRC-SI™ which melt below the Curie temperature of the ceramic layer, have strong bonding capabilities, high flexural strength and pre-stress the ceramic layer upon cooling, may be used to bond adjacent layers of the composite structure 32 together;

Various combinations of metal pre-stress layers, adhesive layers and ceramic layers may be used to fabricate the composite structure 32; and, The layers of the composite structure 32 may be of various other geometric shapes besides rectangular or circular as described above.

Accordingly, the scope of the invention should be determined not by the embodiment illustrated, but by the appended claims and their legal equivalents.

I claim:

1. A method of manufacturing a piezoelectric transducer comprising the steps of:

selecting a thermoplastic adhesive material having a melting temperature and having a first coefficient of thermal contraction;
   wherein said step of selecting a thermoplastic adhesive material comprising selecting an imide selecting a first solid member having an exposed first surface and having a second coefficient of thermal contraction, said first solid member comprising a piezoelectric material;
   wherein said step of selecting a first solid member comprises selecting an electroactive ceramic element;

selecting a second solid member having an exposed second surface and having third coefficient of thermal contraction;
   wherein said step of selecting said second solid member comprises selecting a metallic member;

heating said thermoplastic adhesive material and said second solid member to a first temperature above said melting temperature;

bringing said thermoplastic adhesive material into contact with said first surface of said first solid member and said second surface of said second solid member so as to form a composite structure while said thermoplastic adhesive material and said second solid member are at said first temperature;

applying pressure to said composite structure in a direction perpendicular to each of said first and second surfaces;
   wherein said step of applying pressure to said composite structure comprises placing said composite structure between a first press member and a deformable liner of a second press member, and drawing said first press member toward said second press member;
   and wherein said deformable liner of said second press member comprises a deformable bladder filled with a fluid;

after said step of applying pressure to said composite structure, cooling said composite structure to a third temperature below said melting temperature;
   whereby said step of cooling said composite structure to said third temperature induces a compressive stress into said first solid member;
   wherein said step of cooling said composite structure to a third temperature below said melting temperature inducing said compressive stress into said first solid member deforms said composite structure into an arcuate shape;

after said step of cooling said composite structure to a third temperature, releasing said pressure applied to said composite structure; and then cooling said composite structure to ambient temperature, wherein said step of cooling said composite structure to ambient temperature induces a compressive stress into said first solid member.

* * * * *